(12) United States Patent
Garcia

(10) Patent No.: US 6,806,748 B2
(45) Date of Patent: Oct. 19, 2004

(54) SINUSOIDAL SIGNAL MULTIPLIER CIRCUIT

(75) Inventor: Luc Garcia, Saint Paul de Varces (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/101,561

(22) Filed: Mar. 19, 2002

(65) Prior Publication Data

US 2002/0171460 A1 Nov. 21, 2002

(30) Foreign Application Priority Data

Mar. 21, 2001 (FR) .............................. 01 03794

(51) Int. Cl.$^7$ .............................................. H03B 19/00
(52) U.S. Cl. ....................................... 327/116; 327/119
(58) Field of Search ................................. 327/116, 113, 327/119, 114, 231, 248, 238, 239, 355, 356, 350, 352, 361; 377/47, 48; 329/306; 359/325; 375/324

(56) References Cited

U.S. PATENT DOCUMENTS 4,499,426 A * 2/1985 Parker ........................ 329/323
5,648,736 A * 7/1997 Ishigaki ...................... 327/113
5,883,548 A 3/1999 Assard et al. ............... 329/306
6,417,712 B1 * 7/2002 Beards et al. ............... 327/248

FOREIGN PATENT DOCUMENTS

DE 3138464 A 4/1983
EP 0370539 A1 5/1990
EP 0574083 A1 12/1993

* cited by examiner

Primary Examiner—Linh M. Nguyen
(74) Attorney, Agent, or Firm—Lisa K. Jorgenson; Jose Gutman; Fleit, Kain, Gibbons, Gutman, Bongini & Bianco P.L.

(57) ABSTRACT

A sinusoidal signal multiplier circuit produces an output sinusoidal signal substantially without any DC component. This sinusoidal signal multiplier circuit includes a first multiplication cell receiving a first sinusoidal signal at a first input and a second sinusoidal signal at a second input. The first multiplication cell delivers a first output signal. The sinusoidal signal multiplier circuit also includes a second multiplication cell, identical to the first multiplication cell, that receives the second sinusoidal signal at its first input and the first sinusoidal signal at its second input, and delivers a second output signal. The sinusoidal signal multiplier circuit also includes an adder circuit to add the first output signal and the second output signal to provide from the sinusoidal signal multiplier circuit an output signal substantially without any DC component.

9 Claims, 1 Drawing Sheet

SINUSOIDAL SIGNAL MULTIPLIER CIRCUIT

CROSS-REFERENCE TO RELATED APPLICATION

This application is based upon and claims priority from prior French Patent Application No. 01 03794, filed on Mar. 21, 2001, the entire disclosure of which is herein incorporated by reference.

BACKGROUND OF THE INVENTION

1. Field of the Invention

The present invention relates to a sinusoidal signal multiplier circuit. The invention can be applied, for example, in the field of analog FM demodulators.

2. Description of the Related Art

The multiplier circuits commonly used to multiply sinusoidal signals are asymmetrical cells showing a phase shift between their inputs. An asymmetrical multiplication cell may be modelled in the form of a perfect, two-input multiplier circuit having, at each of its inputs, an element that introduces a phase delay. A modelling of this kind is shown in FIG. 1. The multiplication cell, referenced C, has two inputs E1 and E2 receiving sinusoidal signals, S1(t) and S2(t), and one output S delivering a sinusoidal signal O(t). In this cell, the input signals S1(t) and S2(t) are phase-shifted by phase delay elements, respectively introducing a phase delay ($\phi 1$ and $\phi 2$, and are then multiplied by a perfect multiplier. If the inputs E1 and E2 of the multiplication cell respectively are provided with the signals $S1(t)=A_1*\cos(wt)$ and $S2(t)=A_2*\sin(wt)$, the following signal O(t) is obtained at the output of the multiplication cell:

$$O(t) = A_1 A_2 * \cos(wt - \varphi 1) * \sin(wt - \varphi 2)$$

$$= (A_1 A_2 / 2) * \sin(2wt - \varphi 1 - \varphi 2) + (A_1 A_2 / 2) * \sin(\varphi 1 - \varphi 2)$$

The output signal O(t) comprises a sinusoidal component $(A_1A_2/2)*\sin(2wt-\phi 1-\phi 2)$ and a DC component $(A_1A_2/2)*\sin(\phi 1-\phi 2)$ corresponding to an amplitude offset of the output signal. This additional DC component in the output signal O(t) is undesirable for many applications.

Accordingly, there exists a need for overcoming the disadvantages of the prior art as discussed above.

SUMMARY OF THE INVENTION

It is an aim of the present invention to provide a multiplier circuit capable of delivering an output signal substantially without any DC component.

An aspect of the present invention therefore is a sinusoidal signal multiplier circuit capable of producing an output sinusoidal signal substantially without any DC component, comprising a first multiplication cell receiving a first sinusoidal signal at a first input and a second sinusoidal signal at a second input, the first multiplication cell delivering a first output signal, and the sinusoidal signal multiplier circuit furthermore comprising: a second multiplication cell identical to the first multiplication cell receiving the second sinusoidal signal at its first input and the first sinusoidal signal at its second input, and delivering a second output signal, and an adder circuit to add the first output signal and the second output signal in order to generate from the sinusoidal signal multiplier circuit an output signal that is substantially without any DC component.

BRIEF DESCRIPTION OF THE DRAWING

The features and the various advantages of the invention shall become more evident from the following detailed description, made with reference to the appended drawings, of which FIG. 1, which has already been described, represents a modelling of a classic multiplication cell.

DESCRIPTION OF THE PREFERRED EMBODIMENTS

Figure 1:
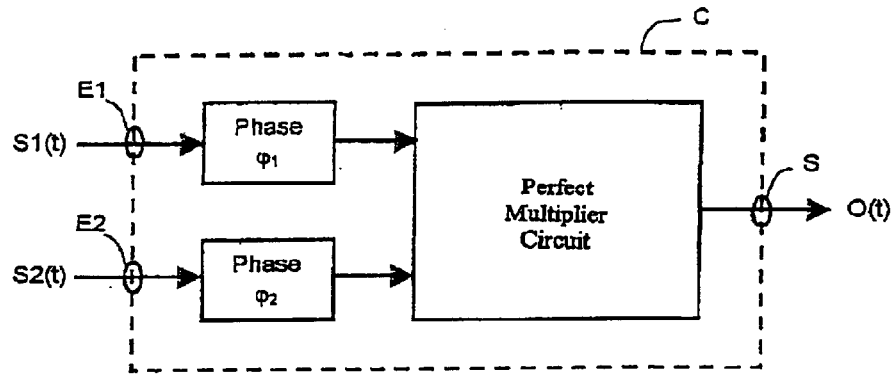
Figure 2:
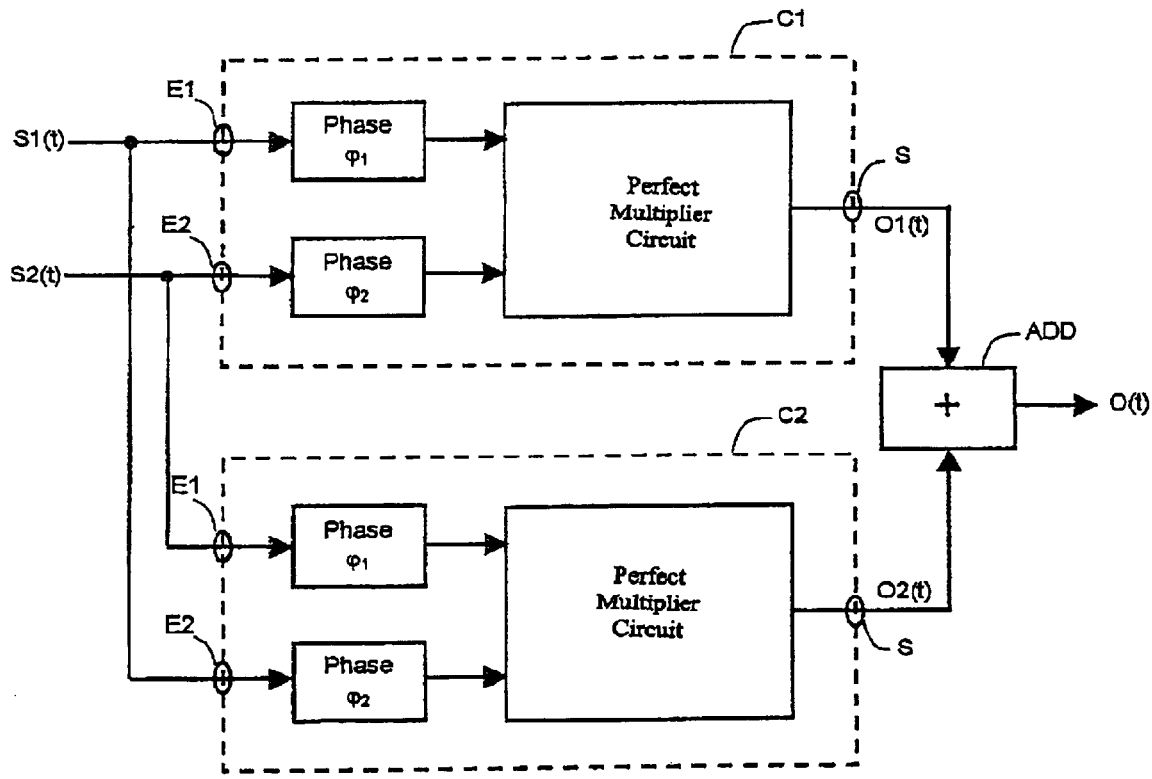
FIG. 2 shows a preferred embodiment of the multiplier circuit of the present invention.

The preferred embodiment of the present invention uses two identical classic multiplication cells and an adder circuit. One embodiment of the multiplier circuit according to the invention is shown in FIG. 2. It has two multiplication cells C1 and C2 identical to the cell shown in FIG. 1. The sinusoidal signal S1(t) is applied to the input E1 of the multiplication cell C1 and to the input E2 of the multiplication cell C2. Conversely, the sinusoidal signal S2(t) is applied to the input E2 of the multiplication cell C1 and to the input E1 of the multiplication cell C2. The output signals referenced O1(t) and O2(t), are added to one another by an adder circuit ADD. The signal obtained at the output of the adder circuit is given by the following formula:

$$O(t) = A_1 A_2 * \sin(2wt - \varphi 1 - \varphi 2) +$$

$$(A_1 A_2 / 2) * \sin(\varphi 1 - \varphi 2) + (A_1 A_2 / 2) * \sin(\varphi 2 - \varphi 1)$$

giving $O(t)=A_1A_2*\sin(2wt-\phi 1-\phi 2)$

The output signal O(t) no longer has any amplitude offset.

In order that the circuit may work properly, the two multiplication cells should have the same defect. This is why the multiplication cells C1 and C2 are preferably paired and made out of the same integrated circuit. A circuit supporting substrate in the integrated circuit preferably supports the paired multiplication cells C1 and C2, and the adder circuit ADD.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A sinusoidal signal multiplier circuit for producing an output sinusoidal signal substantially without any DC component, comprising:

a first multiplication cell having a first input for receiving a first sinusoidal signal and a second input for receiving a second sinusoidal signal, the first multiplication cell for delivering a first output signal;

a second multiplication cell substantially identical to the first multiplication cell having a first input for receiving the second sinusoidal signal and having a second input for receiving the first sinusoidal signal, the second multiplication cell for delivering a second output signal; and an adder circuit, electrically coupled to the first multiplication cell and to the second multiplication cell, for adding the first and second output signals in order to provide out of the sinusoidal signal multiplier circuit an output signal substantially without any DC component, wherein each of the first and second multiplication cells comprises an asymmetrical multiplication cell having at each of its two inputs a delay element to introduce a phase delay to the respective first and second sinusoidal signals.

2. The sinusoidal signal multiplier circuit according to claim 1, wherein the first and second multiplication cells are paired and made on the same integrated circuit.

3. The sinusoidal signal multiplier circuit according to claim 1, wherein the output of the adder circuit provides an output signal substantially without any DC component.

4. The sinusoidal signal muhiplier circuit according to claim 1, wherein the sinusoidal signal multiplier circuit provides an output signal without any DC component.

5. An integrated circuit comprising:

a circuit supporting substrate; and a sinusoidal signal multiplier circuit, disposed on the circuit supporting substrate, for producing an output sinusoidal signal substantially without any DC component, the sinusoidal signal multiplier circuit comprising:

a first multiplication cell having a first input for receiving a first sinusoidal signal and a second input for receiving a second sinusoidal signal, the first multiplication cell for delivering a first output signal;

a second multiplication cell substantially identical to the first multiplication cell having a first input for receiving the second sinusoidal signal and having a second input for receiving the first sinusoidal signal, the second multiplication cell for delivering a second output signal; and an adder circuit, electrically coupled to the first multiplication cell and to the second multiplication cell, for adding the first and second output signals in order to provide out of the sinusoidal signal multiplier circuit an output signal substantially without any DC component, wherein each of the first and second multiplication cells comprises an asymetrical multiplication cell having at each of its two inouts a delay element to introduce a phase delay to the respective first and second sinusoidal signals.

6. The integrated circuit of claim 5, wherein the first and second multiplication cells are paired and made on the same circuit supporting substrate.

7. The integrated circuit of claim 5, wherein the output of the adder circuit provides an output signal substantially without any DC component.

8. The integrated circuit of claim 5, wherein the sinusoidal signal multiplier circuit provides an output signal without any DC component.

9. A method comprising:

receiving a first sinusoidal signal;

receiving a second sinusoidal signal;

providing a first multiplication output signal by adding a first delay to the first sinusoidal signal and a second delay to the second sinusoidal signal, and multiplying the delayed first sinusoidal signal and the delayed second sinusoidal signal;

providing a second multiplication output signal by adding the first delay to the second sinusoidal signal and the second delay to the first sinusoidal signal, and multiplying the delayed first sinusoidal signal and the delayed second sinusoidal signal; and providing an output sinusoidal signal that is substantially without any DC component by adding the first multiplication output signal and the second multiplication output signal.

* * * * *